(12) United States Patent
Do et al.

(10) Patent No.: US 10,784,246 B2
(45) Date of Patent: Sep. 22, 2020

(54) ULTRA-SMALL LED ELECTRODE ASSEMBLY AND METHOD FOR PREPARING SAME

(71) Applicant: SAMSUNG DISPLAY CO., LTD., Yongin-si, Gyeonggi-do (KR)

(72) Inventors: Young Rag Do, Seoul (KR); Yeon Goog Sung, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/070,208

(22) PCT Filed: Jan. 13, 2017

(86) PCT No.: PCT/KR2017/000460
§ 371 (c)(1),
(2) Date: Jul. 13, 2018

(87) PCT Pub. No.: WO2017/123040
PCT Pub. Date: Jul. 20, 2017

(65) Prior Publication Data
US 2019/0035980 A1    Jan. 31, 2019

(30) Foreign Application Priority Data

Jan. 14, 2016  (KR) .................. 10-2016-0004843

(51) Int. Cl.
*H01L 25/075*  (2006.01)
*H01L 33/62*  (2010.01)
(Continued)

(52) U.S. Cl.
CPC .............. *H01L 25/50* (2013.01); *H01L 24/95* (2013.01); *H01L 25/0753* (2013.01); *G02B 6/12* (2013.01);
(Continued)

(58) Field of Classification Search
CPC ... H01L 25/50; H01L 25/0753; H01L 27/153; H01L 2224/80085; H01L 2224/81085;
(Continued)

(56) References Cited

U.S. PATENT DOCUMENTS 6,657,289 B1 *  12/2003  Craig .................. H01L 23/13
                                                    257/678
7,080,444 B1 *   7/2006  Craig ................ H01L 21/67144
                                                    257/E21.705
(Continued)

FOREIGN PATENT DOCUMENTS

JP    2005-209794 A    8/2005
JP    2006-049524 A    2/2006
(Continued)

OTHER PUBLICATIONS

Machine English translation of JP2011-091257. ESPACENET. Translated on Aug. 28, 2019. (Year: 2011).*

*Primary Examiner* — Yu Chen
(74) *Attorney, Agent, or Firm* — Lewis Roca Rothgerber Christie LLP

(57) ABSTRACT

Provided is a method of manufacturing a ultra-small light-emitting diode (LED) electrode assembly, the method including preparing a base substrate, forming an electrode line including a first electrode and a second electrode on the base substrate, positioning a guide member having a plurality of slit portions therein on the base substrate, and inserting ultra-small LED devices into the plurality of slit portions of the guide member.

7 Claims, 5 Drawing Sheets

(51) Int. Cl.
*H01L 25/00* (2006.01)
*H01L 23/00* (2006.01)
*G02B 6/12* (2006.01)

(52) U.S. Cl.
CPC .... *H01L 33/62* (2013.01); *H01L 2224/95085* (2013.01); *H01L 2224/95136* (2013.01)

(58) Field of Classification Search
CPC . H01L 2224/95085; H01L 2224/95123; H01L 2224/95136; H01L 33/20; H01L 33/486; H01L 33/62; H01L 23/544; H01L 2223/54426; H01L 21/50; H01L 21/52; H01L 21/682; H01L 2933/0066; H01L 27/15–156; H01L 2224/95143

See application file for complete search history.

(56) References Cited

U.S. PATENT DOCUMENTS

| | | | | |
|---|---|---|---|---|
| 2005/0250229 | A1* | 11/2005 | Nuggehalli | B81C 1/00007 438/24 |
| 2006/0220989 | A1* | 10/2006 | Hillis | G09G 3/001 345/30 |
| 2008/0023435 | A1* | 1/2008 | Wu | B23K 3/0623 216/2 |
| 2011/0273410 | A1* | 11/2011 | Park | H01L 25/167 345/204 |
| 2013/0027623 | A1* | 1/2013 | Negishi | H01L 25/0753 349/42 |
| 2015/0062484 | A1 | 3/2015 | Lee et al. | |
| 2017/0062393 | A1* | 3/2017 | Kim | H01L 21/6835 |

FOREIGN PATENT DOCUMENTS

| | | | |
|---|---|---|---|
| JP | 2011091257 A | * | 5/2011 |
| KR | 10-2013-0028305 A | | 3/2013 |
| KR | 10-2015-0006798 A | | 1/2015 |

* cited by examiner

ULTRA-SMALL LED ELECTRODE ASSEMBLY AND METHOD FOR PREPARING SAME

TECHNICAL FIELD

The present invention relates to a ultra-small light-emitting diode (LED) electrode assembly and a manufacturing method thereof, and more particularly, to a ultra-small LED electrode assembly which can be used to emit light and a manufacturing method thereof.

BACKGROUND ART

A light-emitting diode (LED) is a semiconductor device having a structure, in which an n type semiconductor crystal in which a large number of carriers are electrons and a p type semiconductor crystal in which a large number of carriers are holes are connected to each other using characteristics of a compound semiconductor, and converts an electrical signal into light having a wavelength range of a desired region and emits the light.

Korean Laid-Open Patent Publication No. 2015-0006798 (publication date: Jan. 19, 2015) discloses a ultra-small LED electrode assembly and a manufacturing method thereof. The ultra-small LED electrode assembly may be manufactured by arranging ultra-small LED devices on an electrode line including a first electrode and a second electrode arranged to be interdigitated with each other.

In the ultra-small LED electrode assembly, the first and second electrodes are formed in a bar shape and arranged in parallel to each other in one direction. The ultra-small LED devices each have a cylindrical shape. The ultra-small LED electrode assembly may be manufactured by applying a solution containing the ultra-small LED devices onto the electrode line to place the ultra-small LED devices on the electrode line.

In this case, light may be emitted when each of the ultra-small LED devices is connected to both the first and second electrodes but a large number of ultra-small LED devices among the plurality of ultra-small LED devices in the solution may not be connected to both the first and second electrodes. Accordingly, when the number of ultra-small LED devices which are not connected to both the first and second electrodes is large, light extraction efficiency may decrease.

DISCLOSURE

Technical Problem

An embodiment of the present invention is directed to a ultra-small light-emitting diode (LED) electrode assembly, in which ultra-small LED devices may be connected to a first electrode and a second electrode without causing the occurrence of a defect such as an electrical short circuit, and a manufacturing method thereof.

Another embodiment of the present invention is directed to a ultra-small LED electrode assembly, in which ultra-small LED devices may be distributed in a predetermined region of an electrode line, and a manufacturing method thereof.

Technical Solution

One aspect of the present invention provides a method of manufacturing a ultra-small light-emitting diode (LED) electrode assembly, the method including preparing a base substrate, forming an electrode line including a first electrode and a second electrode on the base substrate, forming a guide member including a plurality of slit portions on the base substrate, and inserting ultra-small LED devices into the plurality of slit portions of the guide member.

The forming of the guide member including the plurality of slit portions on the base substrate may include aligning the guide member such that the plurality of slit portions of the guide member are perpendicular to the electrode line which is in the form of a line.

The method may further include removing the guide member formed on the base substrate.

The inserting of the ultra-small LED devices into the plurality of slit portions of the guide member may include discharging a solution containing the ultra-small LED devices to a region of the guide member in which the plurality of slit portions are formed.

Another aspect of the present invention provides a ultra-small LED electrode assembly including a base substrate; an electrode line including a first electrode and a second electrode arranged spaced apart from each other on the same plane on the base substrate; a guide member formed on the base substrate and having formed therein a plurality of slit portions positioned to correspond to the electrode line so as to accommodate ultra-small LED devices; and the ultra-small LED devices each having one side connected to the first electrode and another side connected to the second electrode.

A width of each of the plurality of slit portions may be greater than or equal to an external diameter of the ultra-small LED device.

The guide member may be formed in a size corresponding to a size of the base substrate.

The first electrode and the second electrode may be in the form of a line and be formed to be interdigitated with each other. The ultra-small LED device may be positioned on the electrode line to be perpendicular to a lengthwise direction of the first electrode and the second electrode.

The guide member may be formed to cover a surface of the base substrate and a surface of the electrode line.

The guide member may be in the form of a plate and be formed such that a bottom surface thereof is in contact with a top surface of the electrode line.

Advantageous Effects

In a method of manufacturing a ultra-small light-emitting diode (LED) electrode assembly according to an embodiment of the present invention, ultra-small LED devices may be located perpendicular to a first electrode and a second electrode. Accordingly, the number of ultra-small LED devices to be connected to the first and second electrodes among the ultra-small LED devices increases and thus the number of photons discharged to the outside from the ultra-small LED electrode assembly increases, thereby remarkably improving the light extraction efficiency of the ultra-small LED electrode assembly.

In addition, the number of ultra-small LED devices to be placed on an electrode line may be easily adjusted by simply adjusting the number of slit portions to be formed in a guide member.

DESCRIPTION OF DRAWINGS

FIG. 2 is a diagram illustrating a state in which a first electrode and a second electrode are formed on a base substrate.

FIG. 3 is a diagram illustrating a state in which a guide member is formed on the base substrate.

FIG. 4 is a diagram illustrating a process of discharging a solution containing ultra-small LED devices in a state in which the guide member is formed on the base substrate.

FIG. 5 is a diagram illustrating a ultra-small LED electrode assembly according to an embodiment of the present invention.

MODES OF THE INVENTION

Figure 1:
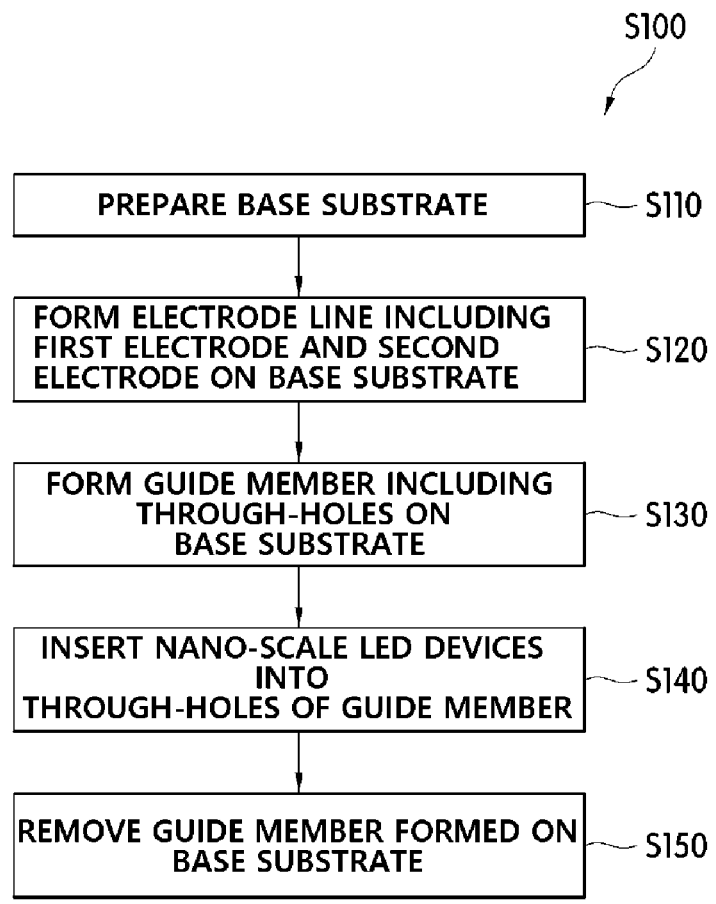
FIG. 1 is a flowchart of a method of manufacturing a ultra-small light-emitting diode (LED) electrode assembly according to an embodiment of the present invention.

Hereinafter, exemplary embodiments of the present invention will be described in detail with reference to the accompanying drawings so that those of ordinary skill in the art can easily implement them. The present invention may be embodied in many different forms and is not limited to the embodiments set forth herein.

For clarity, a description of parts not related to describing the present invention is omitted here, and the same reference numerals are allocated to the same or similar components throughout the disclosure.

Components having the same structure in various embodiments will be allocated the same reference numeral and explained only in a representative embodiment, and components which are different from those of the representative example will be described in the other embodiments.

As used herein, when an element is referred to as being "connected to" another element, the element can be directly connected to the other element or be indirectly connected to the other element having an intervening element therebetween. It will be understood that the terms "comprise" and/or "comprising," when used herein, specify the presence of stated elements but do not preclude the presence or addition of one or more other elements unless mentioned otherwise.

When embodiments of the present invention are described herein, the terms "first electrode" and "second electrode" may be understood to include either electrode regions in which ultra-small LED devices may be actually mounted or not only the electrode regions but also electrode regions which may be further included according to a method of arranging electrodes on a base substrate. However, the ultra-small LED electrode assembly according to the present invention may be understood as an electrode region in which the ultra-small LED devices may be actually mounted.

FIG. 1 is a flowchart of a method of manufacturing a ultra-small light-emitting diode (LED) electrode assembly according to an embodiment of the present invention.

Referring to FIG. 1, a method of manufacturing a ultra-small LED electrode assembly according to an embodiment of the present invention (S100) includes preparing a base substrate (S110), forming an electrode line including a first electrode and a second electrode on the base substrate (S120), forming a guide member including a plurality of slit portions on the base substrate (S130), and inserting ultra-small LED devices into the slit portions of the guide member (S140).

The operations of the above-described method of manufacturing a ultra-small LED electrode assembly according to the embodiment of the present invention will be described in detail with reference to the accompanying drawings.

Figure 2:
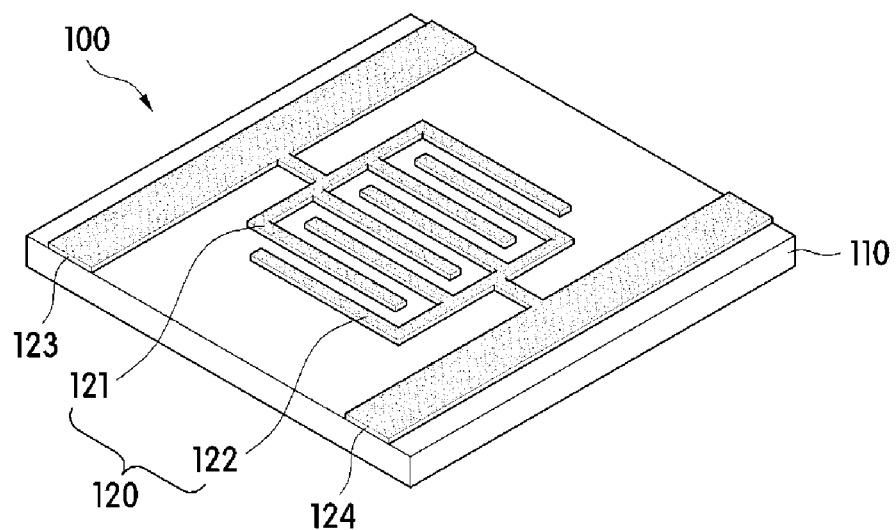
FIGS. 2 to 5 are diagrams sequentially illustrating the method of manufacturing a ultra-small LED electrode assembly.

FIGS. 2 to 5 are diagrams sequentially illustrating the method of manufacturing a ultra-small LED electrode assembly. FIG. 2 is a diagram illustrating a state in which a first electrode and a second electrode are formed on a base substrate.

Referring to FIG. 2, in the preparing of the base substrate (S110), a base substrate 110 is fixed on a support unit (not shown). Here, the support unit may be a support unit used to fix a specific object in a general semiconductor manufacturing process and thus a detailed description thereof is omitted herein.

After the preparing of the base substrate (S110) (see FIG. 1), the forming of the electrode line including the first electrode and the second electrode on the base substrate (S120) (see FIG. 1) is performed.

An example of a method of forming first electrodes 121 and second electrodes 122 on the base substrate 110 will be described below. A photoresist layer 101 may be formed by coating photoresist PR onto the base substrate 110. The photoresist PR may be photoresist generally used in the art. The photoresist PR may be coated onto the base substrate 110 by spin coating, spray coating, or screen coating. Preferably, spin coating may be used but embodiments are not limited thereto.

A thickness of the photoresist PR coated onto the base substrate 110 may be in a range of 0.1 μm to 10 μm. However, the thickness of the coated photoresist PR may be variable according to a manufacturer's design by taking into account a thickness of electrodes to be deposited on the base substrate 110 at a later time.

After the photoresist layer is formed on the base substrate 110 as described above, a mask having formed therein a pattern corresponding to an electrode line 120 on which the first electrodes 121 and the second electrodes 122 are arranged spaced apart from each other on the same plane to be interdigitated with each other may be placed on the photoresist layer 101 and then an upper portion of the mask may be exposed to ultraviolet rays.

Thereafter, unexposed portions of the photoresist layer 101 may be removed by immerging the photoresist layer 101 into a general photoresist solvent, and thereby the exposed portions of the photoresist layer 101 at which the electrode line 120 is to be formed may be removed.

Next, an electrode forming material may be deposited on the base substrate 110 from which the portions of the photoresist layer 101 are removed in the form of a mask having formed therein the electrode line 120. In the case of the first electrode 121, the electrode forming material may include either at least one metal material selected from the group consisting of aluminum, titanium, indium, gold, and silver or at least one transparent material selected from the group consisting of indium tin oxide (ITO), ZnO:Al, CNT-conductive polymer, and a metal nanowire complex.

Preferably, when the electrode forming material includes two or more types of materials, the first electrode 121 may have a structure in which the two or more types of materials are stacked. More preferably, the first electrode 121 may be an electrode formed by stacking two types of materials, e.g., titanium and gold, but is not limited thereto.

In the case of the second electrode 122, the electrode forming material may include either at least one metal material selected from the group consisting of aluminum, titanium, indium, gold, and silver or at least one transparent material selected from the group consisting of ITO, ZnO:Al, CNT-conductive polymer, and a metal nanowire complex. Preferably, when the electrode forming material includes two or more types of materials, the second electrode 122 may have a structure in which the two or more types of materials are stacked. More preferably, the second electrode 122 may be an electrode formed by stacking two types of materials, e.g., titanium and gold, but is not limited thereto.

Materials used to form the first electrode 121 and the second electrode 122 may be the same or different. The electrode forming material may be deposited by heat deposition, e-beam deposition, sputtering deposition, or screen printing, and preferably, heat deposition, but is not limited thereto.

After the deposition of the electrode forming material, the electrode line 120 deposited on the base substrate 110 may be manufactured by removing the photoresist layer coated onto the base substrate 110 with a photoresist remover selected from among acetone, N-methylpyrrolidone (1-Methyl-2-pyrrolidone (NMP)), and dimethyl sulfoxide (DMSO).

A unit electrode area of the electrode line 120 according to the present invention formed by the above-described method, i.e., an area of an arrangement region in which two electrodes are arranged to independently drive ultra-small LED devices 141, may be preferably in a range of 1 $\mu m^2$ to 100 $cm^2$, and more preferably, a range of 10 $\mu m^2$ to 100 $mm^2$, but is not limited thereto.

In the electrode line 120, a distance between the first electrode 121 and the second electrode 122 may be less than or equal to a length of the ultra-small LED device 141. Thus, the ultra-small LED device 141 may be interposed in a lying state between the first electrode 121 and the second electrode 122 or may be connected while lying from the first electrode 121 to the second electrode 122.

In the forming of the electrode line including the first electrode and the second electrode on the base substrate (S120) (see FIG. 1), a first lead electrode 123 and a second lead electrode 124 may be formed together. The first lead electrode 123 and the second lead electrode 124 will be described below.

Figure 3:
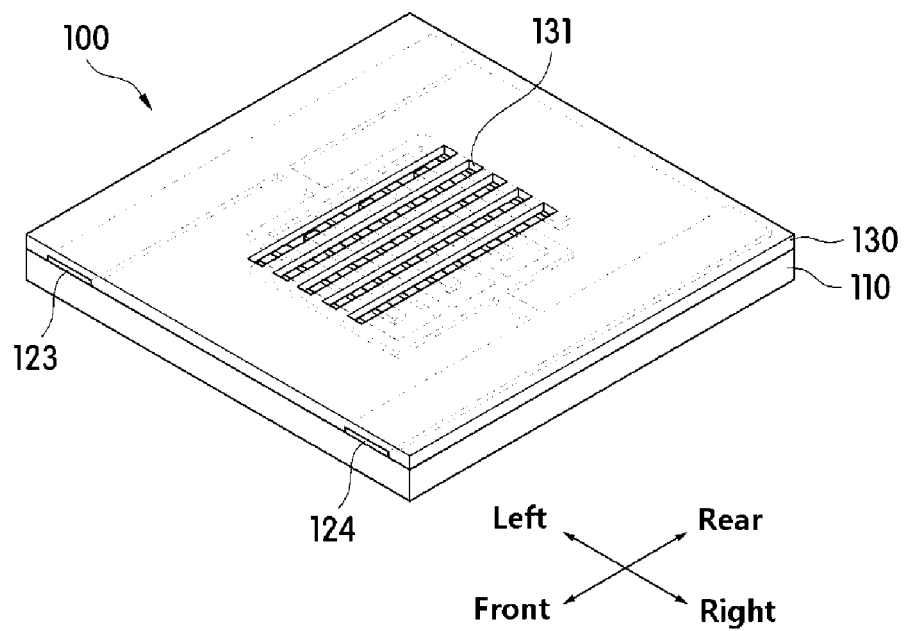

FIG. 3 is a diagram illustrating a state in which a guide member is formed on the base substrate.

Referring to FIG. 3, in the forming of the guide member including the plurality of slit portions on the base substrate (S130) (see FIG. 1), the expression "the forming of the guide member" may be understood to include not only directly forming a guide member 130 on a surface of the base substrate 110 but also positioning the guide member 130 to be spaced apart from the base substrate 110.

For example, the guide member 130 may be formed to cover the surface of the base substrate 110 and a surface of the electrode line 120. Alternatively, although not shown, the guide member 130 may be formed in, for example, a plate shape such that a bottom surface thereof is in contact with a top surface of the electrode line 120. That is, the guide member 130 may be spaced a thickness of the electrode line 120 from the base substrate 110.

When the guide member 130 has the plate shape as described above, in the forming of the guide member including the plurality of slit portions on the base substrate (S130) (see FIG. 1), a process of aligning the guide member may be performed such that a plurality of slit portions 131 of the guide member 130 are perpendicular to the electrode line 120 having a line shape.

More specifically, when the first electrode 121 and the second electrode 122 of the electrode line 120 are formed in parallel in a direction from left to right, the plurality of slit portions 131 may be positioned such that a lengthwise direction thereof is the same as a direction from front to rear. That is, the plurality of slit portions 131 may be positioned to form 90° with the first electrode 121 and the second electrode 122.

In a method of aligning the guide member 130, for example, an align unit (not shown) may be used. The guide member 130 may be aligned on the base substrate 110 using an align unit movable along three axes. The guide member 130 may be coupled to a side of the align unit.

The align unit may be a device capable of moving a target in multiple directions. To this end, the align unit may be any type of device capable of moving a specific member along three or more axes and thus is not limited to a specific structure.

Figure 4:
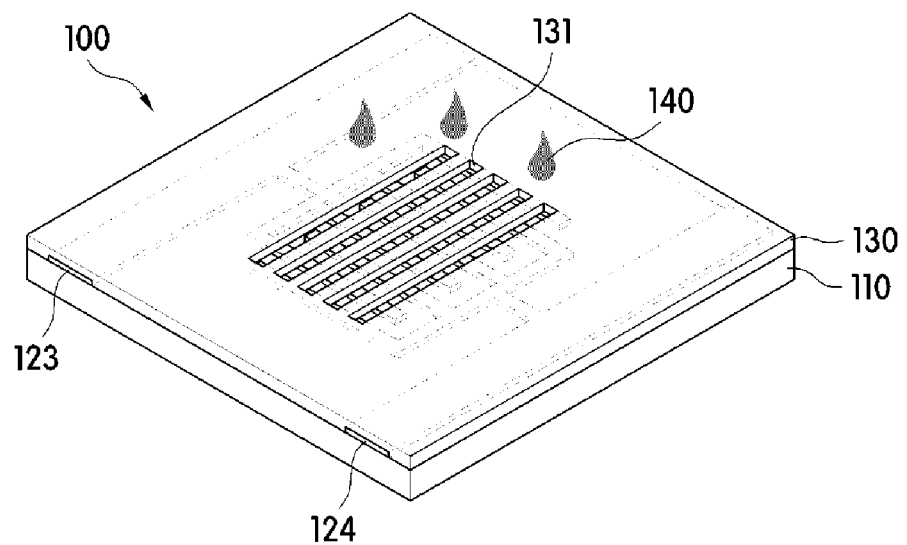
Figure 5:
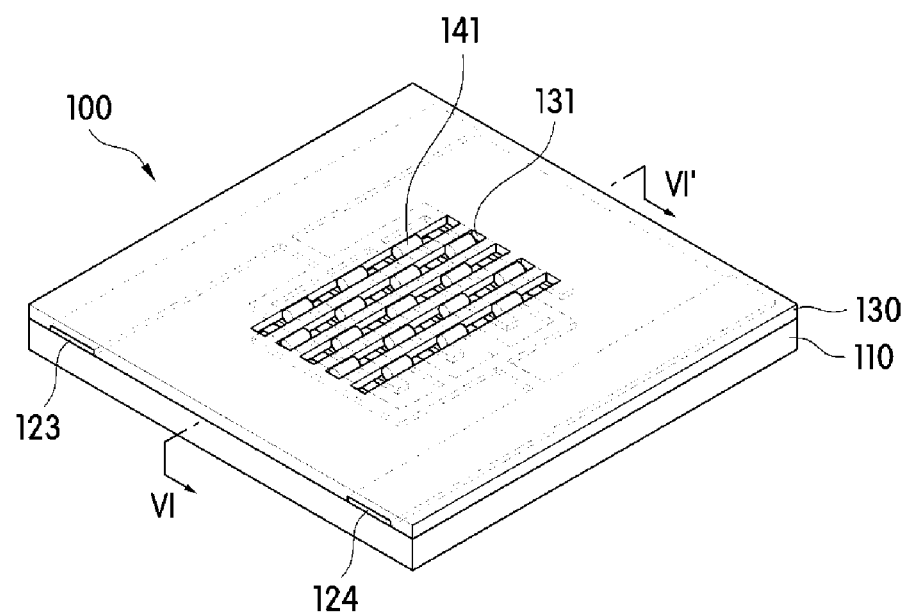

FIG. 4 is a diagram illustrating a process of discharging a solution containing ultra-small LED devices in a state in which the guide member is formed on the base substrate.

As illustrated in FIG. 4, in the inserting of the ultra-small LED devices into the slit portions of the guide member (S140) (see FIG. 1), for example, a solution 140 containing the ultra-small LED devices 141 may be discharged onto a region of the guide member 130 in which the plurality of slit portions 131 are formed.

Here, the solution 140 containing the ultra-small LED devices 141 may be prepared by, for example, mixing the plurality of ultra-small LED devices 141 with a solvent. The solution 140 may be in the form of ink or paste. The solvent may preferably include at least one selected from the group consisting of acetone, water, alcohol, and toluene, and more preferably, acetone. However, the type of the solvent is not limited thereto, and any solvent which is evaporable without physically or chemically influencing the ultra-small LED devices 141 may be used without limitation.

In the solution 140, a content of the ultra-small LED devices 141 may be in a range of 0.001 to 100 parts by weight with respect to 100 parts by weight of the solvent. When the content of the ultra-small LED devices 141 is less than 0.001 parts by weight, the number of ultra-small LED devices 141 connected to the electrodes is small and thus the ultra-small LED electrode assembly 100 may not be operated normally. To solve this problem, the solution 140 may need to be discharged onto the guide member 130 several times. When the content of the ultra-small LED devices 141 is greater than 100 parts by weight with respect to 100 parts by weight of the solvent, alignment of each of the ultra-small LED devices 141 may be interfered with each other.

The ultra-small LED device 141 will be described below. The type of the ultra-small LED device 141 available in the present invention is not limited, provided that it can be generally used in an illumination device or a display device. The length of the ultra-small LED device 141 may be preferably in a range of 100 nm to 10 μm, and more preferably, a range of 500 nm to 5 μm.

In addition, an external diameter of the ultra-small LED device 141 may be in a range of 1 nm to 10 μm, and more preferably, a range of 50 nm to 4 μm.

Here, a highly efficient LED device may be difficult to manufacture when the length of the ultra-small LED device 141 is less than 100 nm, and the luminous efficiency of an LED device may be deteriorated when the length of the ultra-small LED device 141 is greater than 10 μm. The ultra-small LED device 141 may have various shapes, e.g., a cylindrical shape, a cuboid shape, etc., and preferably, the cylindrical shape, but is not limited thereto.

The ultra-small LED device 141 may be a nanorod, a nanocable, a nano cotton ball, or a nano-dumbbell.

Figure 7:
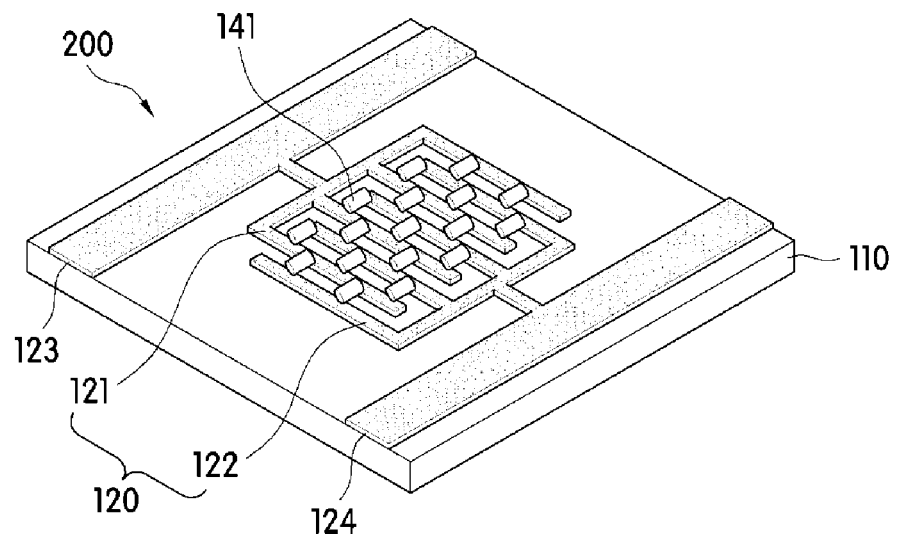
FIG. 7 is a diagram illustrating a ultra-small LED electrode assembly according to another embodiment of the present invention.

FIG. 7 is a diagram illustrating a ultra-small LED electrode assembly according to another embodiment of the present invention.

Referring to FIG. 7, the method of manufacturing a ultra-small LED electrode assembly (S100) (see FIG. 1) according to an embodiment of the present invention may further include removing the guide member formed on the base substrate (S150) (see FIG. 1).

The removing of the guide member formed on the base substrate (S150) (see FIG. 1) may be performed after the insertion of the ultra-small LED devices 141 into the slit portions 131 of the guide member 130. The guide member 130 may be removed by, for example, forming the guide member 130 of a material reacting to (or etched by) only a specific etching solution and removing the guide member 130 with the etching solution, but embodiments are not limited thereto and any method may be used provided that only the guide member 130 can be removed from the base substrate 110.

For example, the guide member may be removed by dry etching.

Figure 6:
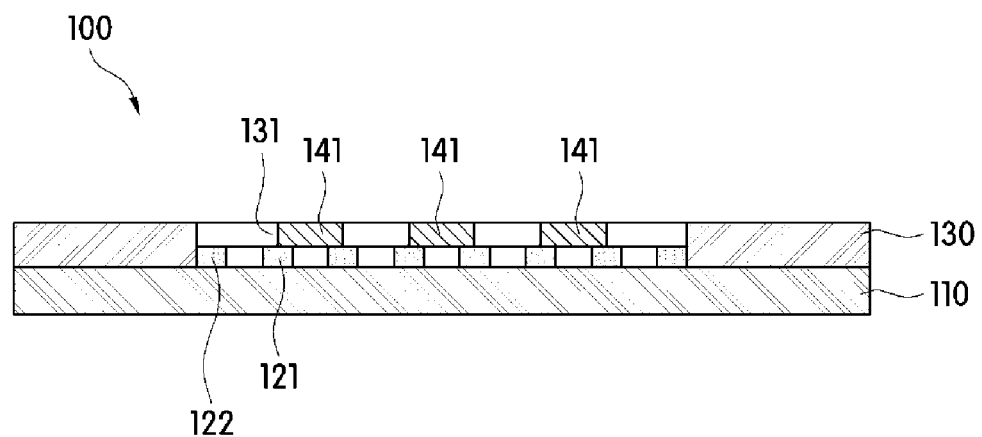
FIG. 6 is a cross-sectional view taken along line VI-VI' of the ultra-small LED electrode assembly of FIG. 5.

Referring back to FIGS. 5 and 6, in the ultra-small LED electrode assembly 100 manufactured by the above-described method of manufacturing a ultra-small LED electrode assembly (S100) (see FIG. 1) according to the embodiment of the present invention, the ultra-small LED devices 141 may be connected to the first electrode 121 and the second electrode 122 to be perpendicular to the first electrode 121 and the second electrode 122.

Accordingly, the number of ultra-small LED devices 141 to be connected to the first electrode 121 and second electrode 122 among the ultra-small LED devices 141 may increase and thus the number of photons discharged to the outside from the ultra-small LED electrode assembly 100 increases, thereby remarkably improving the light extraction efficiency of the ultra-small LED electrode assembly 100.

In addition, the number of ultra-small LED devices 141 to be placed on the electrode line 120 may be easily adjusted by simply adjusting the number of slit portions 131 to be formed in the guide member 130.

The ultra-small LED electrode assembly 100 which may be manufactured by the method of manufacturing a ultra-small LED electrode assembly (S100) (see FIG. 1) according to the embodiment of the present invention will be described in detail below.

The ultra-small LED electrode assembly 100 according to the embodiment of the present invention may include the base substrate 110, the electrode line 120, the guide member 130, and the ultra-small LED devices 141.

The base substrate 110 may be, for example, one selected from among a glass substrate, a quartz substrate, a sapphire substrate, a plastic substrate, and a bendable and flexible polymer film. However, the type of the base substrate 110 is not limited thereto and various other members may be used provided that electrodes can be formed thereon. The base substrate 110 may be formed of a transparent material.

An area of the base substrate 110 is not limited, and may be changed according to a manufacturer's design by taking into account an area of the first electrode 121 and an area of the second electrode 122 to be formed on the base substrate 110, and a size and number of ultra-small LED devices 141 connected to the first electrode 121 and the second electrode 122. For example, a thickness of the base substrate 110 may be in a range of 100 μm to 1 mm but is not limited thereto.

The electrode line 120 include the first electrode 121 and the second electrode 122. The second electrode 122 may be formed to be spaced apart from the first electrode 121. The second electrode 122 may be formed on the same plane as the first electrode 121. For example, the first electrode 121 and the second electrode 122 may be formed on a top surface of the base substrate 110.

The first lead electrode 123 and the second lead electrode 124 may be formed on the base substrate 110. The first lead electrode 123 and the second lead electrode 124 may be formed on the same plane as the first electrode 121 and the second electrode 122. The first electrode 121 is electrically connected to the first lead electrode 123, and the second electrode 122 is electrically connected to the second lead electrode 124.

In the forming of the electrode line including the first electrode and the second electrode on the base substrate (S120) (see FIG. 1), the first lead electrode 123 and the second lead electrode 124 may be formed together with the first electrode 121 and the second electrode 122 but embodiments are not limited thereto.

The guide member 130 is located on the base substrate 110. A size of the guide member 130 may correspond, for example, to that of the base substrate 110. The plurality of slit portions 131 positioned to correspond to the electrode line 120 may be formed in the guide member 130.

The guide member 130 may be formed on the base substrate 110. Here, the forming of the guide member on the base substrate 110 may be understood to mean that the guide member 130 may be directly formed on a surface of the base substrate or be formed spaced apart from an upper part of the base substrate 110.

Figure 8:
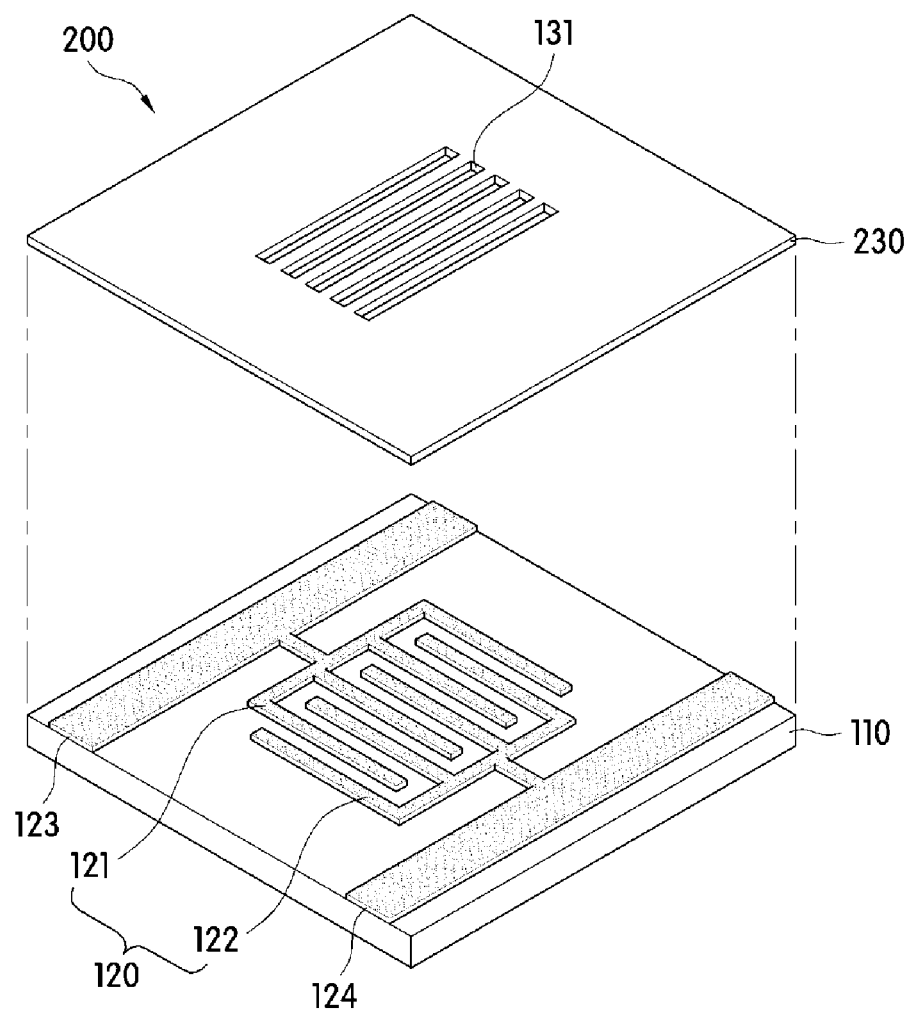
FIG. 8 is a diagram illustrating a process of placing a plate type guide member on a base substrate.

For example, the guide member 130 may be formed to cover the surface of the base substrate 110 and the surface of the electrode line 120. Alternatively, the guide member 130 may be formed on the top surface of the electrode line 120. More specifically, as illustrated in FIG. 8, the guide member 130 may be separately manufactured and then be placed on the base substrate 110 using an align unit (not shown).

Thus, the guide member 130 may be formed such that a bottom surface thereof is in contact with the top surface of the electrode line 120 and the guide member 130 is spaced the thickness of the electrode line 120 from the base substrate 110.

As described above, the plurality of slit portions 131 are formed in the guide member 130. The plurality of slit portions 131 are positioned to correspond to the electrode line 120. The ultra-small LED devices 141 are accommodated in the plurality of slit portions 131. The plurality of slit portions 131 may be formed at certain intervals.

A width of the slit portion 131 may be greater than or equal to the external diameter of the ultra-small LED device 141. However, when the width of the slit portion 131 is greater than the external diameter of the ultra-small LED device 141, the ultra-small LED device 141 may be more smoothly accommodated in the slit portion 131. When the width of the slit portion 131 is greater than the external diameter of the ultra-small LED device 141, the width of the slit portion 131 should be less than the length of the ultra-small LED device 141.

The ultra-small LED device 141 emits light. A plurality of ultra-small LED devices 141 may be provided. One side of the ultra-small LED device 141 is connected to the first electrode 121 and another side thereof is connected to the second electrode 122, In the ultra-small LED electrode assembly 100 according to the embodiment of the present invention, the ultra-small LED device 141 may be located on the electrode line 120 to be perpendicular to a lengthwise direction of the first electrode 121 and the second electrode 122 due to the guide member 130. In this case, the first electrode 121 and the second electrode 122 may be provided in the form of a line to be interdigitated with each other. The ultra-small LED device 141 may have a certain length and be positioned to form 90° with the first electrode 121 and the second electrode 122.

While various embodiments of the present invention have been described above, the drawings referred to herein and the detailed description of the present invention are merely intended to provide examples of the present invention, and are for the purpose of describing the present invention only and are not intended to limit meanings or the scope of the present invention defined in the claims. Thus, it will be apparent to those of ordinary skill in the art that various modifications may be made in the embodiments and equivalent embodiments may be derived from the embodiments. Accordingly, the scope of the present invention to be protected should be determined by the technical scope defined in the appended claims.

The invention claimed is:

1. A light-emitting diode (LED) electrode assembly comprising:
   a base substrate;
   a plurality of first electrodes and second electrodes on the base substrate which extend to a first direction and are spaced apart from each other in a second direction;
   a guide member disposed on the base substrate and having formed therein a plurality of slit portions extending to the second direction and exposing at least a portion of the plurality of first electrodes and second electrodes and the base substrate; and
   a plurality of LED devices disposed in the slit portions of the guide member and, connected to the plurality of first electrodes and second electrodes,
   wherein each LED device has a shape of extending to the second direction, and
   one end of each of the LED devices is disposed on one of the plurality of first electrodes and another end of each of the LED devices is disposed on one of the plurality of second electrodes, and
   a first length of the plurality of first electrodes and second electrodes which is measured in the first direction is longer than a first width of the plurality of first electrodes and second electrodes which is measured in the second direction,
   a second length of the slit portions which is measured in the second direction is longer than a second width of the slit portions which is measured in the first direction, and
   a long axis direction of the plurality of first electrodes and second electrodes is perpendicular to a long axis direction of the slit portions,
   wherein each of the slit portions exposes the plurality of first electrodes and the plurality of second electrodes.

2. The LED electrode assembly of claim 1, wherein a distance between the plurality of first electrodes and the plurality of second electrodes is less than or equal to a length of each of the LED devices, and
   a width of each of the plurality of slit portions is greater than or equal to an external diameter of each of the LED devices such that a LED device from among the plurality of LED devices is interposed in a lying state between a first electrode from among the plurality of first electrodes and a second electrode from among the plurality of second electrodes or is connected to the first electrode from among the plurality of first electrodes and the second electrode from among the plurality of second electrodes while lying from the first electrode to the second electrode of the plurality of first electrodes and second electrodes.

3. The LED electrode assembly of claim 1, wherein the guide member is formed in a size corresponding to a size of the base substrate.

4. The LED electrode assembly of claim 1, wherein the guide member is formed to cover a surface of the base substrate and a surface of at least one of the first and second electrodes.

5. The LED electrode assembly of claim 1, wherein the guide member is positioned to be spaced apart from the base substrate.

6. The LED electrode assembly of claim 5, wherein, when the guide member is positioned to be spaced apart from the base substrate during the forming of the guide member, the guide member is aligned on the base substrate using an align unit movable along three axes.

7. The LED electrode assembly of claim 1, wherein each of the slit portions has a constant width along an entire length of the slit portion in a plane parallel to the base substrate.

* * * * *